(12) United States Patent
Kim et al.

(10) Patent No.: US 8,709,954 B2
(45) Date of Patent: Apr. 29, 2014

(54) WAFER RECYCLING METHOD

(75) Inventors: Kyung Jun Kim, Gwangju (KR); Hyo Kun Son, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 1157 days.

(21) Appl. No.: 12/144,261

(22) Filed: Jun. 23, 2008

(65) Prior Publication Data

US 2008/0318426 A1    Dec. 25, 2008

(30) Foreign Application Priority Data

Jun. 25, 2007  (KR) ........................ 10-2007-0062004

(51) Int. Cl.
*H01L 21/302* (2006.01)
*H01L 21/461* (2006.01)
*B44C 1/22* (2006.01)
*C03C 15/00* (2006.01)
*C03C 25/68* (2006.01)
*C23F 1/00* (2006.01)
*C23F 3/00* (2006.01)

(52) U.S. Cl.
USPC ........... 438/745; 438/689; 438/752; 438/635; 216/52; 216/58; 216/74

(58) Field of Classification Search
None
See application file for complete search history.

(56) References Cited

U.S. PATENT DOCUMENTS

| 6,627,001 B2 * | 9/2003 | Chen ................................ 134/3 |
| 6,711,775 B2 * | 3/2004 | Mikhaylich et al. .............. 15/77 |
| 2005/0170611 A1 * | 8/2005 | Ghyselen et al. ............. 438/458 |

OTHER PUBLICATIONS

Davydov et al, Thermodynamic Assessment of Gallium-Nitrogen System, 2001, Phys. Stat. Sol, vol. 188 No. 1, pp. 407-410.*
Pich et al, in situ decomposition study of GaN thin films, 1998, Journal of Crystal Growth, 187, pp. 329-332.*

* cited by examiner

*Primary Examiner* — Nadine Norton
*Assistant Examiner* — Stephanie Duclair
(74) *Attorney, Agent, or Firm* — Birch, Stewart, Kolasch & Birch, LLP

(57) ABSTRACT

A wafer recycling method comprises varying a temperature and pressure conditions to remove a first semiconductor layer deposited on a wafer, removing a remaining semiconductor layer on the wafer through a chemical or physical process, and washing the wafer.

7 Claims, 2 Drawing Sheets

WAFER RECYCLING METHOD

CROSS-REFERENCE TO RELATED APPLICATIONS

The present application claims priority under 35 U.S.C. 119 and 35 U.S.C. 365 to Korean Patent Application No. 10-2007-0062004 (filed on Jun. 25, 2007), which is hereby incorporated by reference in its entirety.

BACKGROUND

The present disclosure relates to a wafer recycling method.

Semiconductor devices are manufactured by forming a plurality of semiconductor layers on wafers.

For example, a light emitting diode may be formed by depositing a first conductive nitride semiconductor layer, an active layer, a second conductive nitride semiconductor layer. A gallium nitride (GaN) layer may be used as the nitride semiconductor layer.

Meanwhile, after the semiconductor layers are formed on the wafer, the semiconductor device may malfunction due to a variety of reasons such as a process error, a malfunctioning of equipments, and the like. In this case, the wafer may fall into disuse or be recycled by removing the semiconductor layers.

Further, even when the semiconductor device normally operates, there is a need to recycle the wafer by removing the semiconductor layers due to other reasons.

SUMMARY

Embodiments provide a wafer recycling method.

Embodiments provide a wafer recycling method that can effectively remove a semiconductor layer deposited on the wafer.

In an embodiment, a wafer recycling method comprises varying a temperature and pressure conditions to remove a first semiconductor layer deposited on a wafer removing a remaining semiconductor layer on the wafer through a chemical or physical process, and washing the wafer.

In an embodiment, a wafer recycling method comprises separating an atom binding of a semiconductor layer deposited on a wafer by varying a temperature and pressure conditions, and washing the wafer.

It is to be understood that both the foregoing general description and the following detailed description of the present invention are exemplary and explanatory, and are intended to provide further explanation of the invention as claimed.

DETAILED DESCRIPTION OF THE EMBODIMENTS

Reference will now be made in detail to the embodiments of the present disclosure, examples of which are illustrated in the accompanying drawings.

Figure 1:
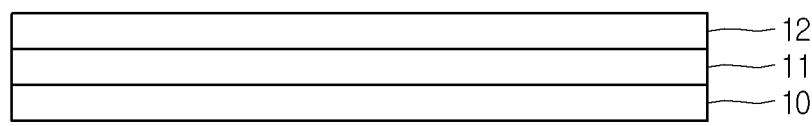
FIG. 1 is an exemplary view of a semiconductor layer deposited on a wafer.

FIG. 1 is an exemplary view of a semiconductor layer deposited on a wafer.

Referring to FIG. 1, a buffer layer 11 and a nitride semiconductor layer 12 may be formed on a wafer 10. The nitride semiconductor layer 12 includes a gallium nitride (GaN).

Meanwhile, the GaN has a very strong binding structure. For example, a melting condition of the GaN is 2,490K, 60,000 bar.

In the embodiment, a wafer recycling method is provided. In the wafer recycling method, the GaN deposited on the wafer 10 is separated into Ga and N by varying a temperature/pressure condition. The remaining semiconductor layer is removed through a chemical or physical method. That is, the binding between the atoms are separated by varying the temperature/pressure condition.

Figure 2:
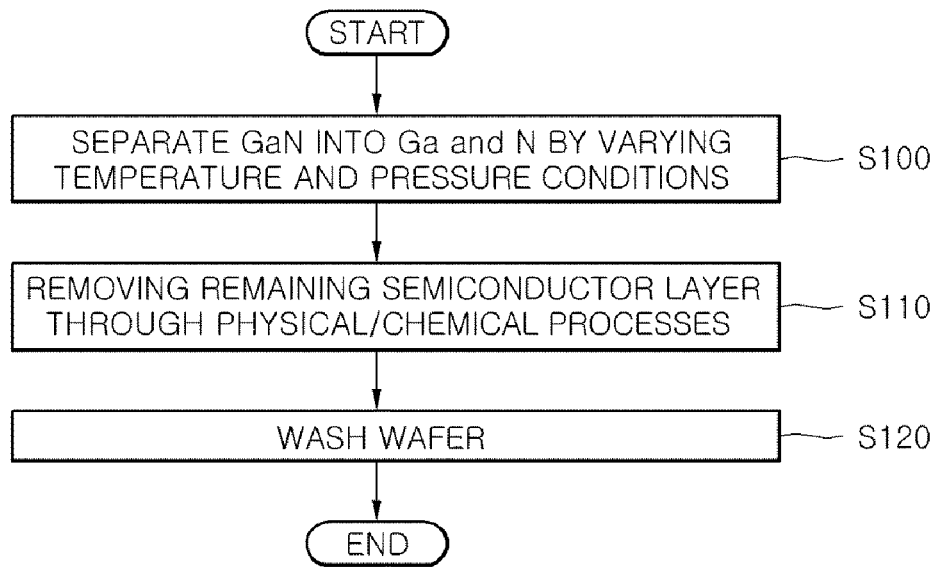
FIG. 2 is a flowchart illustrating a wafer recycling method according to an embodiment.

FIG. 2 is a flowchart illustrating a wafer recycling method according to an embodiment.

Referring to FIG. 2, first, the GaN is separated into Ga and N by varying the temperature/pressure condition (S100).

The separation of GaN can be performed by using any equipment that is capable of baking by which the temperature and pressure can be varied. For instance, the separation of GaN can be realized by a metal organic chemical vapor deposition (MOCVD) equipment.

In addition, at least one of hydrogen, nitrogen, argon gas, and inert gas may be used as carrier gas for setting the pressure.

Figure 3:
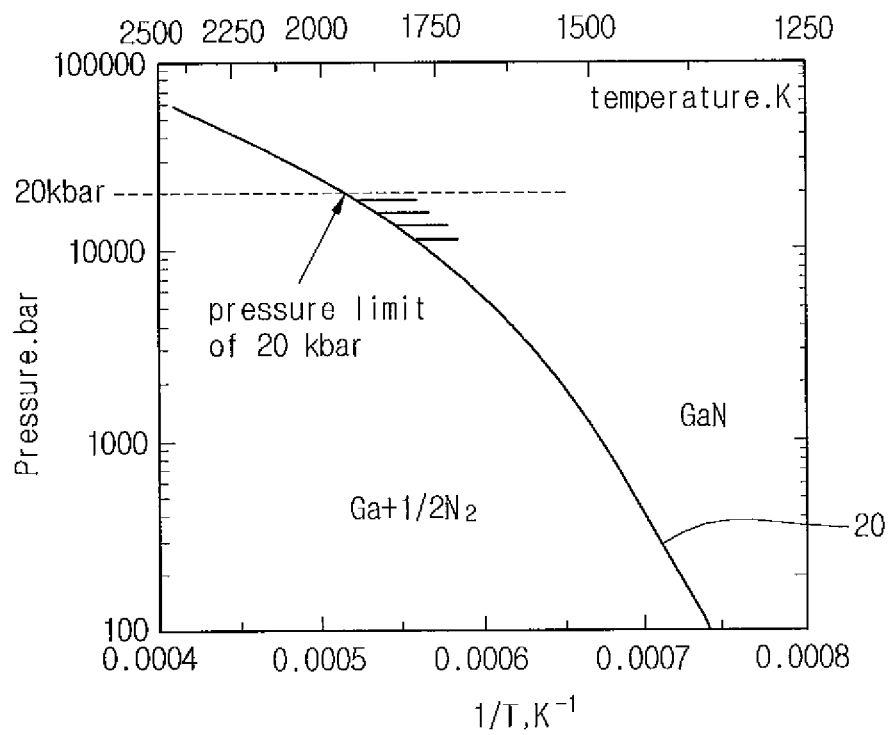
FIG. 3 is a view illustrating a part of a phase-change graph of GaN according to a temperature and pressure.

FIG. 3 is a view illustrating a part of a phase-change graph of GaN according to a temperature and pressure.

As shown in FIG. 3, the GaN may exist as GaN having a strong binding structure or may be separated into liquid-phase Ga and gas-phase based on a boundary line 20 in accordance with the variation of the temperature and pressure.

For example, when the temperature is 2000K and the pressure is 1,000 bar, the GaN is separated into the liquid-phase Ga and the gas-phase N.

In addition, when the temperature is 1500K and the pressure is 10,000 bar, the GaN exists in a solid state having a strong binding structure.

In the wafer recycling method of the embodiment, the GaN deposited on the wafer 10 is separated into the liquid-phase Ga and the gas phase N by varying the temperature and pressure conditions, thereby being removed from the wafer 10.

For example, the binding structure of the GaN is separated by setting the temperature within a range of 400-3000° C. and the pressure within $10^{-9}$-$10^7$ torr Next, the remaining semiconductor layer one the water 10 is removed by a physical or chemical method (S110).

For example, the buffer layer 11 is removed through a wet or dry etching process or through a polishing process. At this point, a chemical mechanical polishing (CMP) process may be used as the polishing process.

Finally, the wafer 10 is washed (S120).

The washing process may include a chemical washing operation using a chemical solution or a physical washing operation using a brush.

Here, the chemical washing operation may be performed by using a first chemical solution containing ammonium hydroxide ($NH_4OH$) that is excellent in removing an organic pollutant or a second chemical solution containing hydrochloric acid that is excellent in removing an inorganic pollutant.

As described above, when the washing process is finished, only the wafer before the semiconductor layers are deposited remains and thus the wafer can be reused.

Although the embodiment discloses the wafer recycling through the removal of the nitride thin films, the present invention is not limited to this. Even when the thin films is deposited using other materials, the thin films can be removed through the method of the embodiment so that the wafer can be recycled.

As described above, the embodiment provides the wafer recycling method that can effectively remove the semiconductor layers deposited on the wafer.

Any reference in this specification to "one embodiment," "an embodiment," "example embodiment." Etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A wafer recycling method, comprising:
    varying a temperature and pressure conditions to remove a first semiconductor layer including GaN deposited on a wafer by separating the first semiconductor layer into a liquid-phase material and a gas-phase material;
    removing a remaining semiconductor layer on the wafer through a chemical or physical process; and
    washing the wafer via a chemical washing process that uses a first chemical solution containing ammonium hydroxide ($NH_4OH$) for removing an organic pollutant and a second chemical solution containing hydrochloric acid for removing an inorganic pollutant,
    wherein the GaN is separated into a liquid-phase Ga and a gas-phase N by setting the temperature within a range of about 2000 K-about 2490 K and the pressure using argon gas within about 1000 bar-about 60,000 bar by a metal organic chemical vapor deposition equipment.

2. The wafer recycling method according to claim 1, wherein the chemical process uses a wet etching process or a dry etching process.

3. The wafer recycling method according to claim 1, wherein the physical process uses a chemical mechanical polishing process.

4. A wafer recycling method, comprising:
    separating an atom binding of a semiconductor layer including GaN deposited on a wafer by varying a temperature and pressure conditions by separating the semiconductor layer into a liquid-phase material and a gas-phase material; and
    washing the wafer via a chemical washing process that uses a first chemical solution containing ammonium hydroxide ($NH_4OH$) for removing an organic pollutant and a second chemical solution containing hydrochloric acid for removing an inorganic pollutant,
    wherein the GaN is separated into a liquid-phase Ga and a gas-phase N by setting the temperature within a range of about 2000 K-about 2490 K and the pressure using argon gas within about 1000 bar-about 60,000 bar by a metal organic chemical vapor deposition equipment.

5. The wafer recycling method according to claim 4, comprising removing a remaining semiconductor layer on the wafer through a chemical or physical process.

6. The wafer recycling method according to claim 5, wherein the chemical process uses a wet etching process or a dry etching process.

7. The wafer recycling method according to claim 5, wherein the physical process uses a chemical mechanical polishing process.

* * * * *